United States Patent
Ohtsuka

(10) Patent No.: US 6,791,313 B2
(45) Date of Patent: Sep. 14, 2004

(54) ELECTRICAL CURRENT DETECTOR HAVING A U-SHAPED CURRENT PATH AND HALL-EFFECT DEVICE

(75) Inventor: Koji Ohtsuka, Kawagoe (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/689,017

(22) Filed: Oct. 20, 2003

(65) Prior Publication Data

US 2004/0080307 A1 Apr. 29, 2004

Related U.S. Application Data

(62) Division of application No. 09/723,440, filed on Nov. 28, 2000, now Pat. No. 6,683,448.

(30) Foreign Application Priority Data

Dec. 20, 1999 (JP) .......................................... 11-361178

(51) Int. Cl.[7] ............................................. G01R 33/00

(52) U.S. Cl. ............................... 324/117 H; 324/117 R; 324/126

(58) Field of Search ......................... 324/117 H, 117 R, 324/126–127, 251–252; 338/32 H

(56) References Cited

U.S. PATENT DOCUMENTS

| | | | | |
|---|---|---|---|---|
| 4,123,772 A | * | 10/1978 | Janssen | 257/427 |
| 5,260,614 A | * | 11/1993 | Theus et al. | 327/362 |
| 5,426,364 A | * | 6/1995 | Yi | 324/251 |
| 5,604,433 A | * | 2/1997 | Theus et al. | 324/251 |
| 5,640,085 A | * | 6/1997 | Petr et al. | 324/105 |
| 5,841,272 A | * | 11/1998 | Smith et al. | 324/117 H |
| 6,232,832 B1 | * | 5/2001 | Kirkpatrick, II | 327/560 |

* cited by examiner

Primary Examiner—Vinh P. Nguyen
(74) Attorney, Agent, or Firm—Woodcock Washburn LLP

(57) ABSTRACT

A current detector for detecting or measuring an electric current includes two Hall effect devices each for generating a voltage proportional to magnetic field strength and two current path terminals for the inflow and outflow, respectively, of a current to be detected or measured.

6 Claims, 14 Drawing Sheets

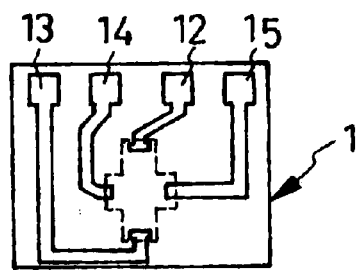
FIG.3
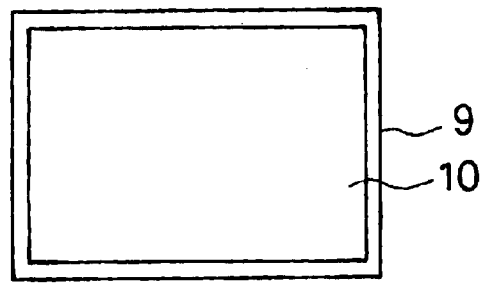
FIG.4
FIG.5
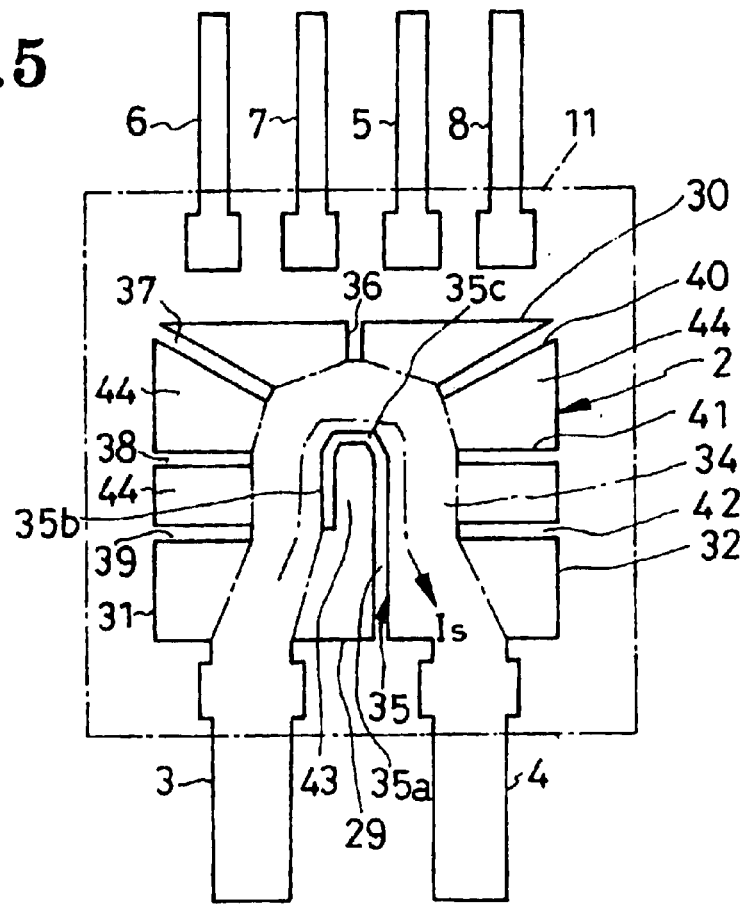

ELECTRICAL CURRENT DETECTOR HAVING A U-SHAPED CURRENT PATH AND HALL-EFFECT DEVICE

CROSS REFERENCE TO RELATED APPLICATIONS

This application is a divisional of U.S. patent application Ser. No. 09/723 440, currently allowed, filed Nov. 28, 2000, now U.S. Pat. No. 6,683,448 which claims the benefit of Japanese Patent Application No. 11-361178, filed Dec. 20, 1999, each of which are hereby incorporated by reference in their entireties.

BACKGROUND OF THE INVENTION

This invention relates to current detectors, and particularly to that utilizing a Hall-effect device for obtaining a voltage proportional to the magnitude of the current detected. More particularly, the invention deals with how to increase the current magnitude that can be handled by such a current detector.

By the term "Hall-effect device" used herein and in the claims appended hereto is meant the voltage generator built on the familiar Hall effect to give an output voltage in direct proportion to the magnetic field applied. Disposed contiguous to a current path, the Hall-effect device will be subjected to the magnetic field that is generated in proportion to the magnitude of the current flowing through the path. The result will be the production of a voltage proportional to the current magnitude. It is self-evident, then, that the current path should lie as proximate as feasible to the Hall-effect device for maximum possible detection sensitivity.

For accomplishment of this objective, the instant, applicant proposed in PCT/JP99/05408 to create an insulating film over a Hall-effect device formed in a semiconductor substrate and, on this insulating film, a current path formed from a conductor layer for carrying a current to be detected. The current path is thus spaced from the Hall-effect device only a distance equal to the thickness of the insulating film.

This prior art current detector proved to be unsatisfactory, however, in the magnitude of the current that can be carried by the conductor layer current path. It could withstand a current of only 10 amperes or so. Current detectors capable of handling currents of much greater magnitude, say 100 amperes, are in strong demand.

SUMMARY OF THE INVENTION

The present invention aims at the provision of a current detector of the type incorporating a Hall-effect device, that is capable of accurately detecting or measuring a current of far greater magnitude than heretofore.

Another object of the invention is to achieve the first recited object by making use of a preexisting part of the current detector, adding no part thereto and making it no sore complex or expensive in construction.

Yet another object of the invention is to achieve the first recited object while at the same time enhancing the sensitivity of the current detector to the maximum possible degree.

Briefly, the current detector according to the invention may be summarized as comprising a Hall-effect device for generating a voltage proportional to magnetic field strength, and a metal-made baseplate mechanically supporting the Hall-effect device. The baseplate is slitted according to the novel concepts of the invention to define a current path having a pair of opposite extremities connected respectively to current path terminals for the inflow and outflow of a current to be detected or measured. The baseplate itself, and therefore the current path defined therein, are sufficiently close to the Hall-effect device to cause the same to generate a voltage proportional to the magnitude of the current flowing through the current path.

Typically, the current path in the baseplate is in the shape of a U, extending contiguous to the Hall-effect device for most effectively causing the same to generate the Hall voltage. The U-shaped current path can be delineated as by cutting in the baseplate a J-shaped slit to delimit its inside boundary, and a set of straight slits to bound its outside boundary.

The metal-made baseplate can well tolerate a current of 100 amperes or so. The current path requires no dedicated part other than the preexisting parts of the current detector, so that the current detector according to the invention is even more compact than comparable prior art devices. Furthermore, since the current path is defined by cutting narrow slits in the baseplate, this baseplate is not deprived of its intrinsic function of mechanically supporting the Hall-effect device.

The above and other objects, features and advantages of the invention and the manner of realizing them will become more apparent, and the invention itself will best be understood, from the following description taken together with the attached drawings showing the preferred embodiments of the invention.

BRIEF DESCRIPTION OF THE DRAWINGS

FIG. 3 is a plan view of the Hall-effect device included in the FIG. 1 current detector;

FIG. 4 is a plan view of an insulating plate, together with a shielding layer thereon, included in the FIG. 1 current detector;

FIG. 5 is a plan view showing the sheet-metal baseplate with the current path defined therein according to the invention, pair of current-path terminals, and other terminals of the FIG. 1 current detector in their relative positions;

DESCRIPTION OF THE PREFERRED EMBODIMENTS

Figure 1:
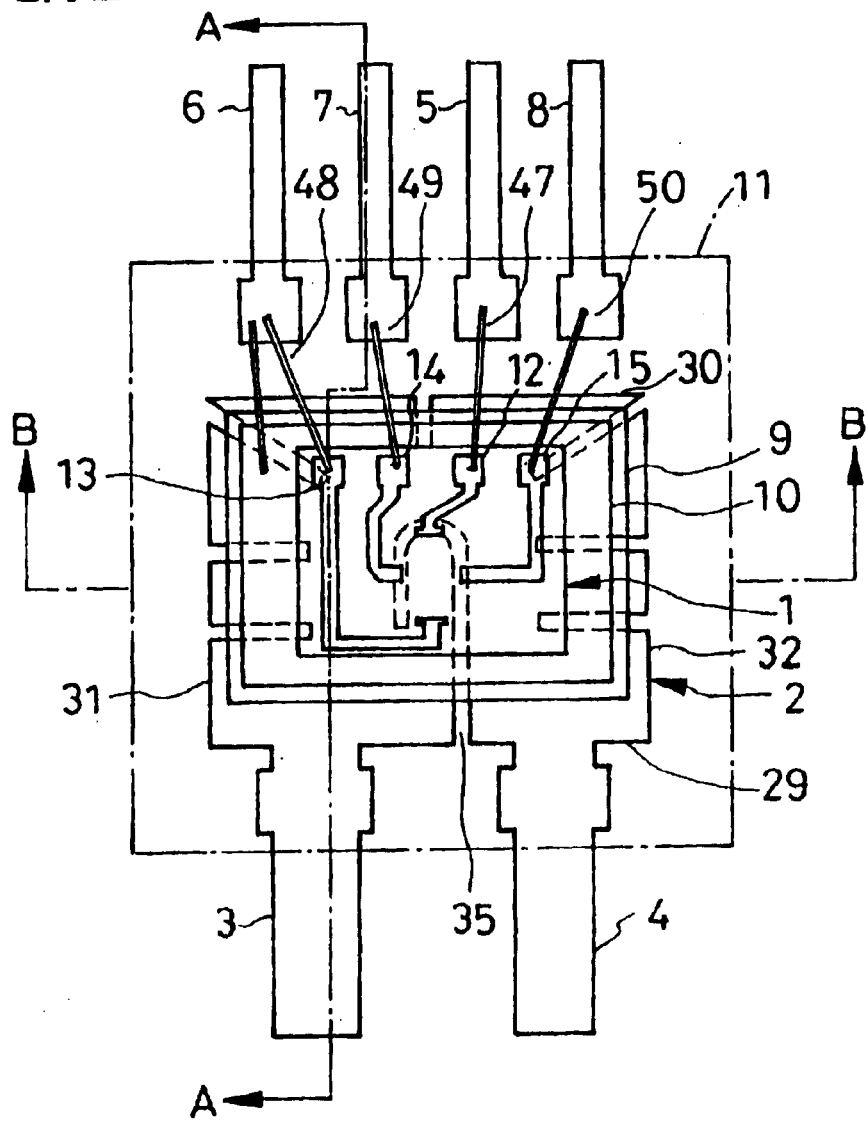
FIG. 1 is a plan view of the current detector embodying the principles of the instant invention, the view showing the encapsulation in phantom outline to reveal other parts.
Figure 2:
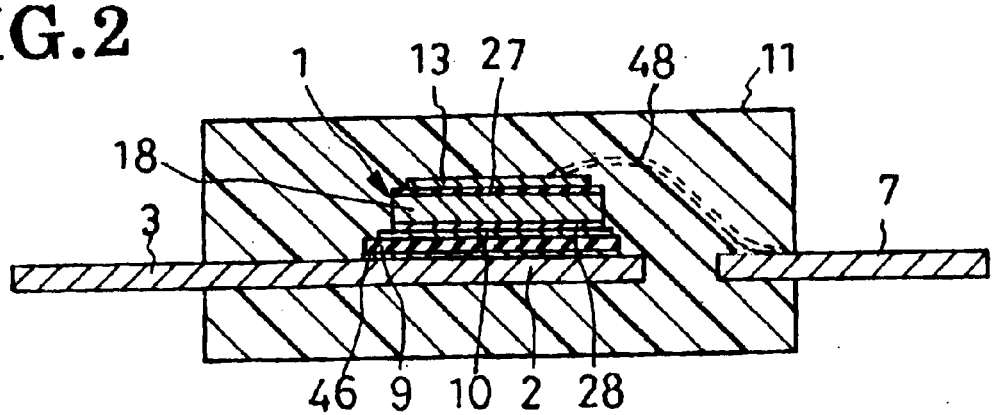
FIG. 2 is a section through the current detector, taken along the line A—A in FIG. 1.

The general makeup of the first preferred form of current detector according to the invention, shown in FIGS. 1—9, will become apparent from a study of FIGS. 1 and 2 in particular. The representative current detector comprises:

1. A Hall-effect device 1 for providing an output voltage indicative of the magnitude of a current to be detected or measured.
2. A metal-made baseplate 2 mechanically supporting the Hall-effect device and having an elongate current path defined therein according to the invention for the flow of the current to be detected.
3. Two current path terminals 3 and 4 formed in one piece with the baseplate 2 and joined directly to the opposite ends of the current path in the baseplate, for the inflow and out-flow, respectively, of the current to be detected.
4. Four lead terminals 5, 6, 7 and 8 for connection of the Hall-effect device 1 to external circuits.
5. An insulating plate 9 between Hall-effect device 1 and baseplate 2.
6. A shielding layer 10 between Hall-effect device 1 and insulating plate 9.
7. A plastic envelope 11 in which the current detector is encapsulated, with only parts of the noted current path terminals 3 and 4 and lead terminals 5–8 left exposed.

As seen in a plan view as in FIGS. 1 and 3, the Hall-effect device 1 is approximately square in shape, having four electrodes 12, 13, 14 and 15 of aluminum or like material aligned along one edge thereof. FIG. 9 shows that the electrodes 12–15 are connected respectively to the four semiconductor regions 19, 20, 21 and 22 of a semiconductor substrate 18, FIG. 8. As indicated also in FIG. 9, the electrodes 12 and 13 are to be connected to a control current supply circuit 16 of well known construction for inputting a control current therefrom, and the electrodes 14 and 15 to a differential amplifier 17 for putting out a Hall voltage, in use of this device. Actually, however, the electrodes 12–15 are not directly connected to these external circuits but are wired to the lead terminals 5–8, respectively, which are to be connected to the circuits 16 and 17. The terminals 5 and 6 are therefore the control current input terminals, and the terminals 7 and 8 the Hall-voltage output terminals.

Figure 7:
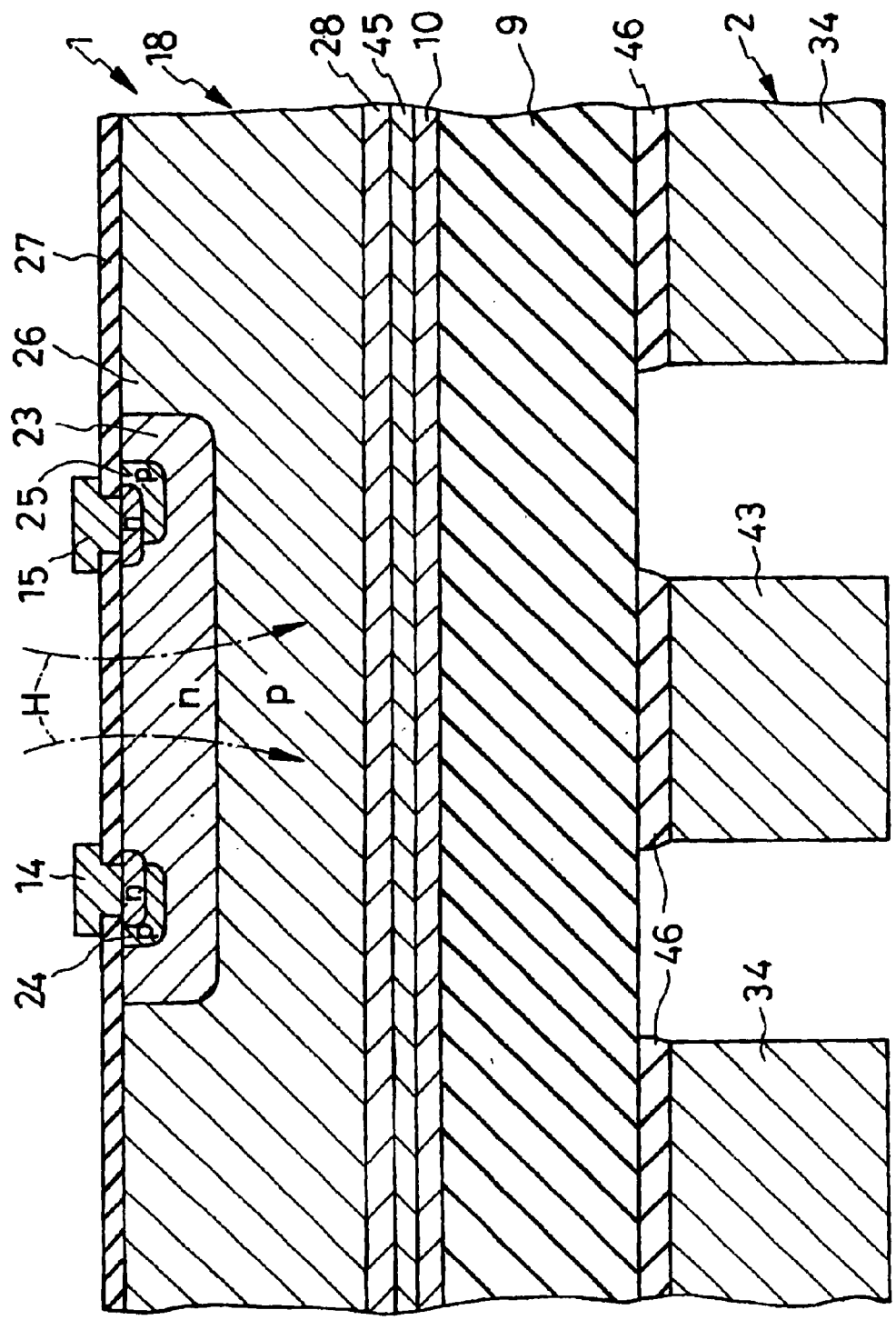
FIG. 7 is an enlarged, fragmentary section through the FIG. 1 current detector, taken along the line B—B therein.
Figure 8:
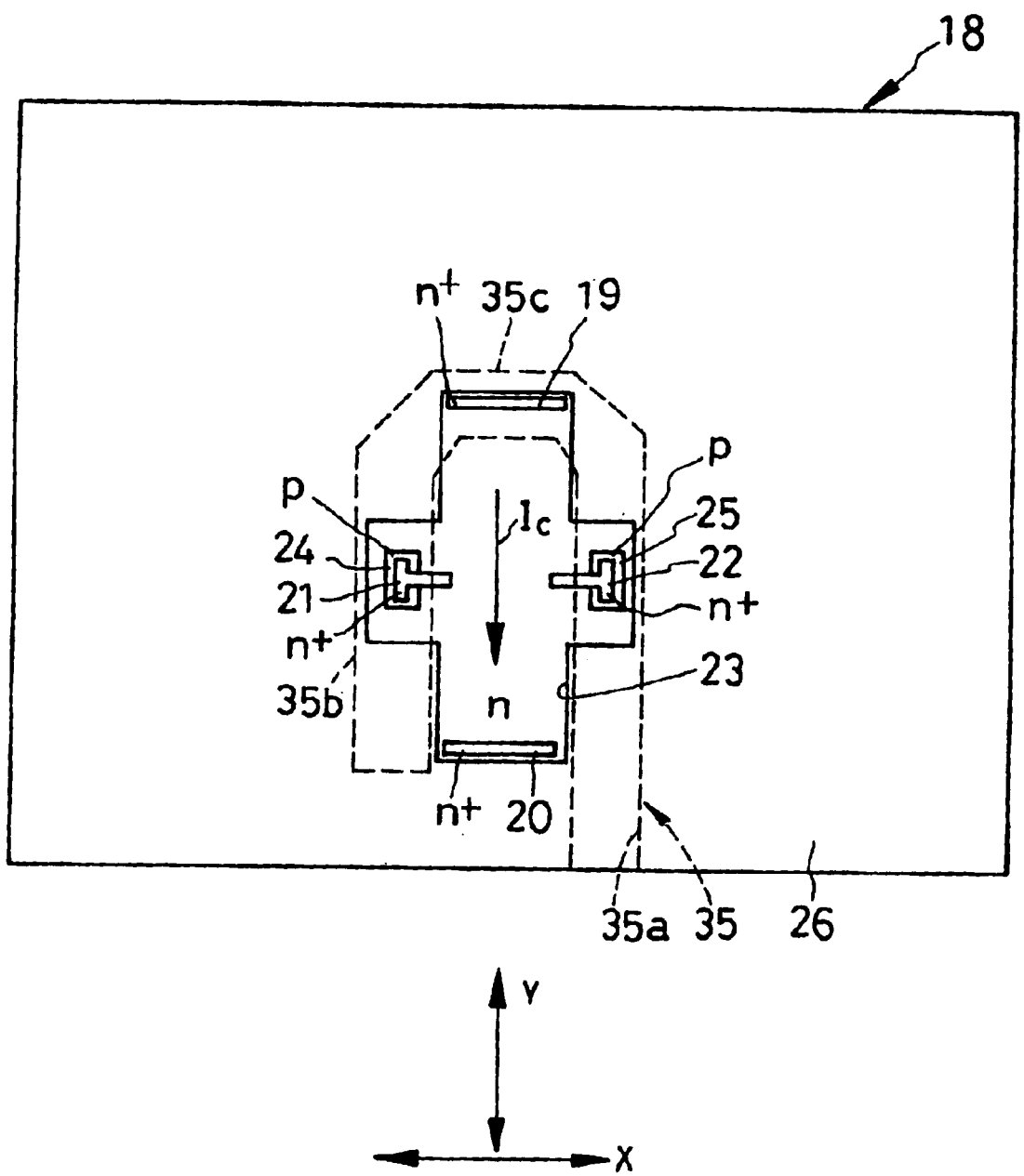
FIG. 8 is a slightly enlarged plan view of the semiconductor substrate, together with the Hall-effect device formed therein, of the FIG. 1 current detector, the view showing in particular the primary working part of the Hall-effect device for the development of a voltage proportional to the current magnitude.
Figure 9:
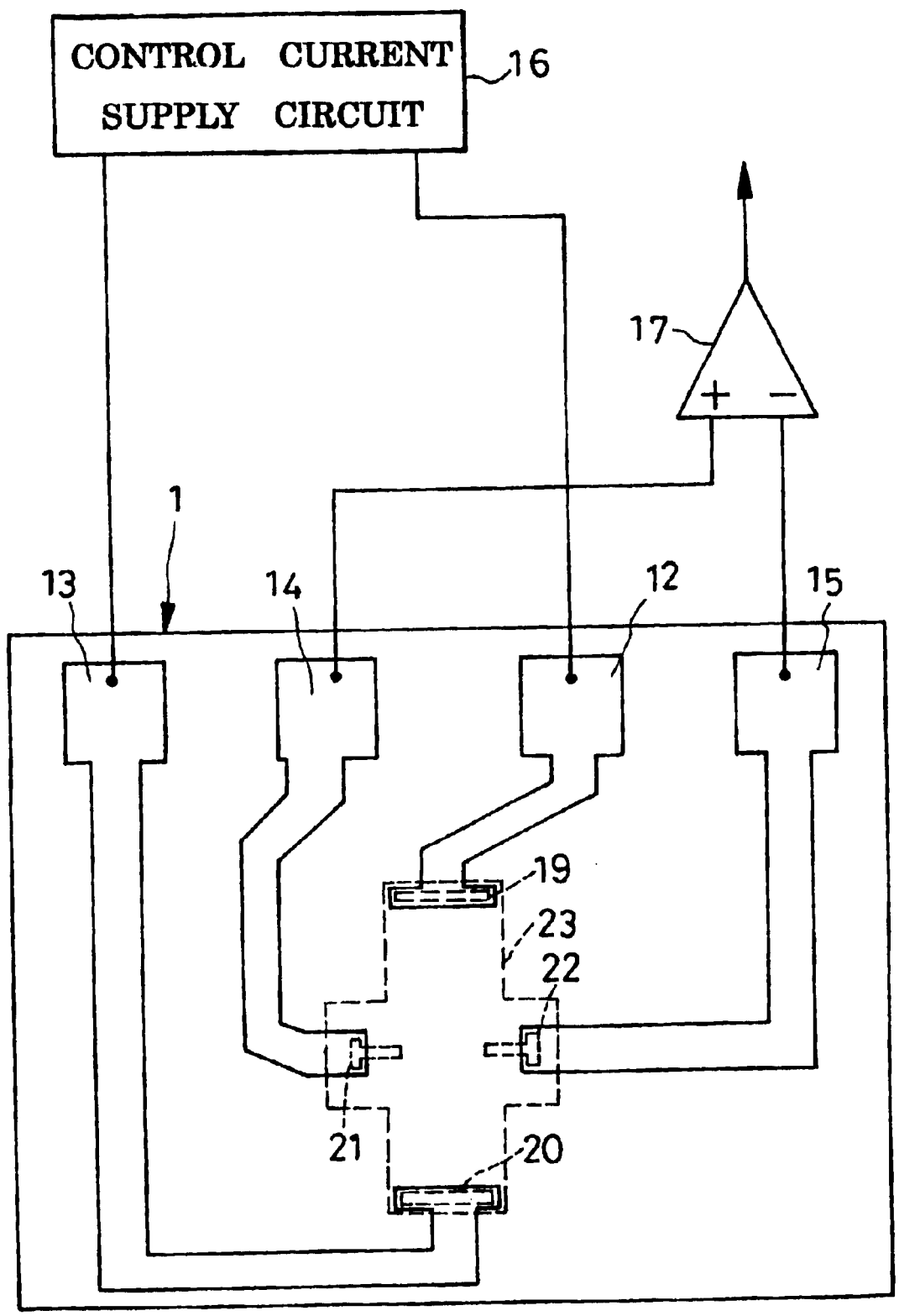
FIG. 9 is an enlarged diagram of the Hall-effect device of the FIG. 1 current detector, shown together with a control current supply circuit and an amplifier which are herein shown connected directly to the electrodes of the Hall-effect device for simplicity.

With reference to FIGS. 7 and 8 in particular, generally in the shape of a rectangular sheet of silicon, the semiconductor substrate 18 has four other semiconductor regions 23, 24, 25 and 26 than the aforesaid four semiconductor regions 19–22. Of n conductivity type, the fifth semiconductor region 23 takes the form of an island of cruciate shape, as seen in a plan view as in FIG. 8, formed in the middle of the p-type eighth semiconductor region 26 which occupies most part of the semiconductor substrate 18.

The first and the second semiconductor region 19 and 20 are of $n^+$ type, higher in impurity concentration than the fifth semiconductor region 23, and are formed as islands, spaced from each other in the y direction in FIG. 8, in the fifth semiconductor region 23. The first and the second electrode 12 and 13 are in ohmic contact with these semiconductor regions 19 and 20. When the control current supply circuit 16 is connected to the electrodes 12 and 13 as in FIG. 9, the control current $I_c$ is to flow through the fifth semiconductor region 23 from first 19 to second 20 semiconductor region, as indicated by the arrow in FIG. 8.

Of $n^+$ type, with an impurity concentration higher than that of the fifth semiconductor region 23, the third and the fourth semiconductor region 21 and 22 lie approximately centrally of the fifth semiconductor region 23 in the y direction in FIG. 8, which is at right angles with the x direction, with a spacing from each other in the x direction. These semiconductor regions 21 and 22 are partly contiguous to the fifth semiconductor region 23, partly to the p type sixth and seventh semiconductor regions 24 and 25, and are in ohmic contact with the third and fourth electrodes 14 and 15. The semiconductor regions 24 and 25 are intended to limit the areas of contact of the semiconductor regions 21 and 22 with the semiconductor region 23.

The Hall voltage is to be obtained between the third and the fourth semiconductor region 21 and 22 when the control current $I_c$ is made to flow between the first and the second semiconductor region 19 and 20, with a magnetic field perpendicular to the direction of current flow. Therefore, the term "primary working part" of the Hall-effect device, as used herein and in the claims appended hereto, may be construed at least as that part of the fifth semiconductor region 23 which lies between the first and the second semiconductor region 19 and 20 and, additionally, between the third and the fourth semiconductor region and 22. More broadly, however, the fifth semiconductor region 23 as a whole may be considered to constitute the primary working part of the Hall-effect device.

With reference to both FIGS. 2 and 7 the semiconductor substrate 18 has a film 27 of silicon oxide or like insulating material formed on its top surface, as seen in these figures, and a layer 28 of aluminum or like nonmagnetic metal formed on its bottom surface. The four electrodes 12–15, shown in FIGS. 1, 3 and 9 and two seen in FIG. 7, are formed on the insulating film 27 and electrically connected respectively to the semiconductor regions 19–22 through windows therein.

FIG. 5 best indicates that the metal-made baseplate 2 is approximately square in shape, having a pair of opposite edges 29 and 30 and another pair of opposite edges 31 and 32. The current path terminals 3 and 4 project approximately right-angularly from the edge 29 of the baseplate 2, so that this baseplate is to serve itself as a path of the current from terminal 3 to terminal 4.

Figure 6:
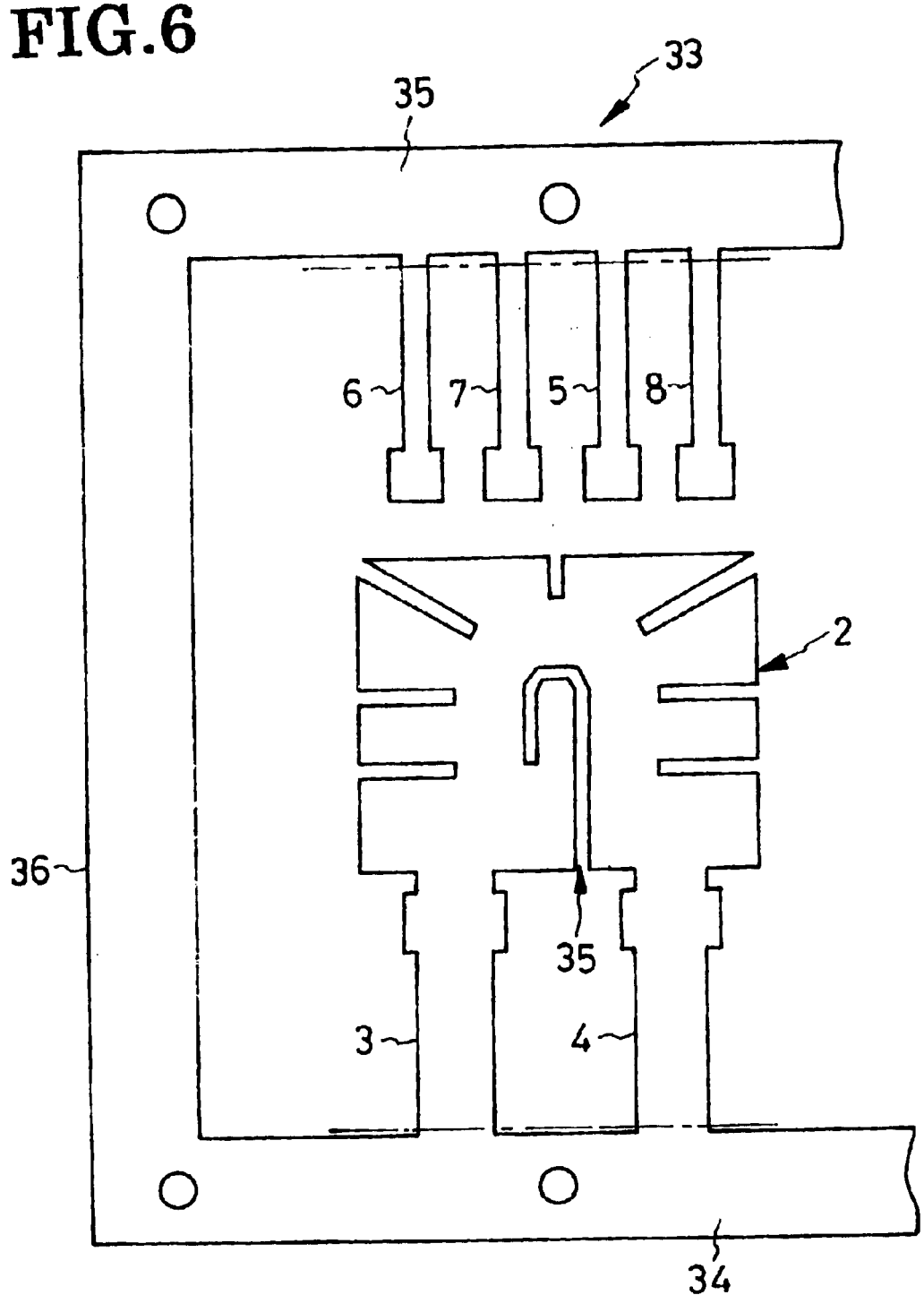
FIG. 6 is a plan view of a sheet-metal punching for use in the fabrication of the baseplate and terminals shown in FIG. 5.

The baseplate 2 with the current path terminals 3 and 4, as well as the Hall-effect-device terminals 5–8, can all be fabricated from a sheet-metal punching shown in FIG. 6 and therein generally designated 33. Typically made from sheet copper with nickel plating, the punching 33 has a frame portion 34 bridging the current path terminals 3 and 4, another frame portion 35 bridging the Hall-effect-device terminals 5–8, and still other frame portions 36 bridging the frame portions 34 and 35. All the terminals 3–8 are to be cut off the frame portions 33 and 34 along the dot-and-dash lines after the current detector has been encapsulated in the plastic envelope 11, FIGS. 1, 2 and 5. FIG. 6 shows a punching fragment for the baseplate 2 and terminals 3–8 of one current detector according to the instant invention; in practice, there may be fabricated such punchings each including the baseplates and terminals of many such current detectors.

The baseplate 2 is intended to serve not only as the mechanical support for the Hall-effect device 1 but as a heat radiator and, according to a feature of this invention, partly as a path of the current to be detected. For successful fulfillment of all these intended functions the baseplate 2 may be fabricated to approximately the same thickness as the semiconductor substrate 18, that is, from 0.5 to 1.0 millimeter, and with a size somewhat larger than that of the semiconductor substrate. As a consequence, when the Hall-effect device 1 is positioned on the baseplate 2 via the insulating plate 9 as shown in FIG. 1, the four edges 29–32 of the baseplate all project beyond the edges of the Hall-effect device 1 and the insulating plate 9.

As indicated by the dot-and-dash lines in FIG. 5, the current Is to be detected is to flow through the baseplate 2 substantially along the inverted-U-shaped path 34. This current path is defined according to the invention by cutting in the baseplate 2 several slits that delimit the opposite side edges of the current path, as will be detailed hereinbelow with reference to FIG. 5.

The slits delineating the current path 34 includes, perhaps most importantly, a slit 35 in the shape of an inverted J bounding one, or inner, side edge of the U-shaped current path. This J slit 35, as it will be so called hereinafter, is cut into the baseplate from its edge 29 in a position intermediate the two current path terminals 3 and 4 joined thereto. More specifically, the J slit 35 is constituted of a longer straight limb 35a extending rectilinearly from the edge 29 of the baseplate 2 toward, and terminating some distance short of, the opposite edge 30, a bight 35c bent right-angularly from the longer straight limb 35a toward the edge 31 of the baseplate, and a shorter straight limb 35b extending from the bight 35c approximately halfway back toward the edge 29 of the baseplate in parallel spaced relationship to the longer straight limb 35a.

Further, in order to delimit the other, or outer, edge of the current path 34, a plurality of, seven in this particular embodiment, additional slits 36–42 are formed in the baseplate 2. All these additional slits are straight. The first straight slit 36 extends from the baseplate edge 30 toward the opposite edge 29 and terminates short of the bight 35c of the J slit 35. The second straight slit 37 extends from the corner between the baseplate edges 30 and 31 toward the geometric center of the baseplate 2 and terminates short of the J slit 35. The third and the fourth straight slit 38 and 39 extend from the baseplate edge 31 toward the opposite edge 32 and terminates short of the shorter straight limb 35b of the J slit 35. The fifth straight slit 40 extends from the corner between the baseplate edges 30 and 32 toward the geometric center of the baseplate 2 and terminates short of the J slit 35. The sixth and the seventh straight slit 41 and 42 extend from the baseplate edge 32 toward the opposite edge 31 and terminates short of the longer straight limb 35a of the J slit 35.

Thus the U-shaped current path 34 through the baseplate 2 is delineated by and between the J slit 35 and the broken line connecting the inside ends of the seven straight slits 36–42. It will be appreciated that, as the current path has its pair of opposite side boundaries formed by narrow slits, rather than by other large openings, no substantial part of the baseplate is lost. The baseplate will therefore amply perform its inherent function of mechanically supporting and reinforcing the current detector.

The current path terminals 3 and 4, which are to be connected to an external circuit for current detection, are of one-piece construction with the baseplate 2, joined directly to the opposite ends of the current path 34. The current Is may flow through the path 34 either from terminal 3 to terminal 4 or vice versa.

FIG. 8 is explanatory of the positional relationship between the J slit 35 in the baseplate 2 and the semiconductor region 23, the primary working part, of the Hall-effect device 1, as seen in a plan view as in this figure, or in a direction normal to the plane of the baseplate 2. It will be observed that the semiconductor region 23 is mostly surrounded by the J slit 35, or thoroughly contained within the outer edges of the J slit, or, as will be noted by referring back to FIG. 5 for example, thoroughly contained between the pair of parallel limbs of the U-shaped current path 34. More specifically, the distance between the outer edges of the two straight limbs 35a and 35b of the J slit 35 is equal to, or just slightly more than, the maximum dimension of the semiconductor region 23 in the x direction. Further the total dimension of the straight limb 35b and bight 35c of the J slit 35 in the y direction is approximately equal to the dimension of the semiconductor region 23 in the same direction.

The "primary working part" of the Hall-effect device 1 has been previously broadly defined as the fifth semiconductor region 23. It has also been stated, however, that the "primary working part" in the more strict sense of the term is that part of the fifth semiconductor region 23 which lies between the first and the second semiconductor region 19 and 20 and between the third and the fourth semiconductor region 21 and 22. In compliance with this more strict definition of the term, the size of the J slit 35 may be redefined as such that the strict "primary working part" of the Hall-effect device is thoroughly contained inside the outer edges of the J slit.

With reference to FIG. 5 again, the midpart 43 of the baseplate 2 which is surrounded by the J slit 35 is joined to the current path 34 as the limb 35b of the J slit is made shorter than the other limb 35a This midpart 43 is left to serve as the head radiator and the mechanical support for the Hall-effect device 1. The fins 44, so to say, which are likewise left outside the J slit 35 do not take part in the current path but serve as heat radiators and mechanical supports for the Hall-effect device 1.

The insulating plate 9, FIGS. 1, 2, 4 and 9, is an approximately square piece of sheet ceramic, among other insulating materials, which is slightly larger in size than the Hall-effect device 1. Overlying the baseplate 2 as in FIGS. 2 and 7 and bonded thereto via an electrically insulating adhesive layer 46, the insulating plate 9 functions to insulate the Hall-effect device 1 from the baseplate and to mechanically support the Hall-effect device as well as the shielding layer 10 directly overlying the insulating plate.

The shielding layer 10 is a sheet of copper or like material attached to the conductor layer 28 on the underside of the Hall-effect device 1 via a layer 45 of a nonmagnetic bonding material such as solder. The shielding layer 10 shields the Hall-effect device 1 from the influence of external electric fields. It is understood that the shielding layer 10 is electrically connected to the control current supply terminal 6, which is grounded.

With reference back to FIG. 1 the four electrodes 12–15 of the Hall-effect device 1 are electrically connected to the control current input terminals 5 and 6 and the voltage output terminals 7 and 8 via wires 47–50, respectively. The plastic envelope 11 encloses all of the current detector but parts of the terminals 3–8.

Operation

For detection or measurement of the current Is flowing through any desired electric circuit, by the current detector of the above described construction, the current path terminals 3 and 4 may be connected to that electric circuit. Further the control current input terminals 5 and 6 may be connected to the control current supply circuit 16, FIG. 9, for causing the control current Ic, FIG. 8, to flow through the fifth semiconductor region 23 from the first 19 to the second 20 semiconductor region, and the voltage output terminals 7 and 8 to the differential amplifier 17.

Introduced into the current detector from the current path terminal 3, for instance, th current Is to be measured will flow through the baseplate 2 along the U-shaped current path 34, which is disposed very close to the fifth semiconductor region 23, the primary working part, of the Hall-effect device 1. The magnetic field H will be generated which, according to the Ampere rule, will be oriented in the direction indicated by the broken-line arrows in FIG. 7. This direction of the magnetic field is perpendicular to the direction of the control current Ic flowing through the semiconductor region 23, so that the Hall voltage will be generated between the semiconductor regions 21 and 22, FIGS. 8 and 9, hence between the electrodes 14 and 15, and hence between the Hall voltage output terminals 7 and 8. The Hall voltage is proportional to the strength of the magnetic field H, which in turn is proportional to the magnitude of the current Is, so that this current is detectable from the Hall voltage.

The advantages gained by the above described embodiment of the invention may be recapitulated as follows:

1. The current path through the detector is formed in the metal-made baseplate 2 mechanically supporting the Hall-effect device. Consequently, a current of as large magnitude as, say, 100 amperes can be made to flow through the current path in sufficient proximity to the Hall-effect device for accurate measurement.
2. The current path in the baseplate is defined in the shape of a U by cutting the J slit 35 therein, and the semiconductor region 23, the primary working part, of the Hall-effect device is thoroughly contained inside the periphery of the current path, as seen in a plan view as in FIG. 8. As a result, sufficient magnetic flux acts on this semiconductor region 23 to realize high detection sensitivity.
3. The current path in the baseplate is narrowed by creating straight slits 36–42. Concentrated current flow through this path results in an increase in magnetic lines of flux actually working on the Hall-effect device.
4. The fins 44 left unremoved outside the current path serve as heat radiators, making possible the detection of large current without overheating.
5. The inside of the U-shaped current path is also left largely unremoved, being bounded by the J slit. The unremoved part 43, FIG. 5, serves as a heat radiator and mechanical support for the Hall-effect device.
6. Larger in size than the Hall-effect device, the slitted baseplate can nevertheless stably support the device.
7. Despite their proximity, the Hall-effect device 1 and the baseplate are effectively electrically isolated from each other by the insulating plate 9.
8. All but parts of the terminals 3–8 of the current detector is encapsulated for greater structural stability and operational reliability.
9. Noise due to external magnetic and electric fields is eliminated by the shielding layer 10.
10. The baseplate 2 and the terminals 3–8 are inexpensively fabricated from common sheet-metal punchings.

Second Form

Figure 10:
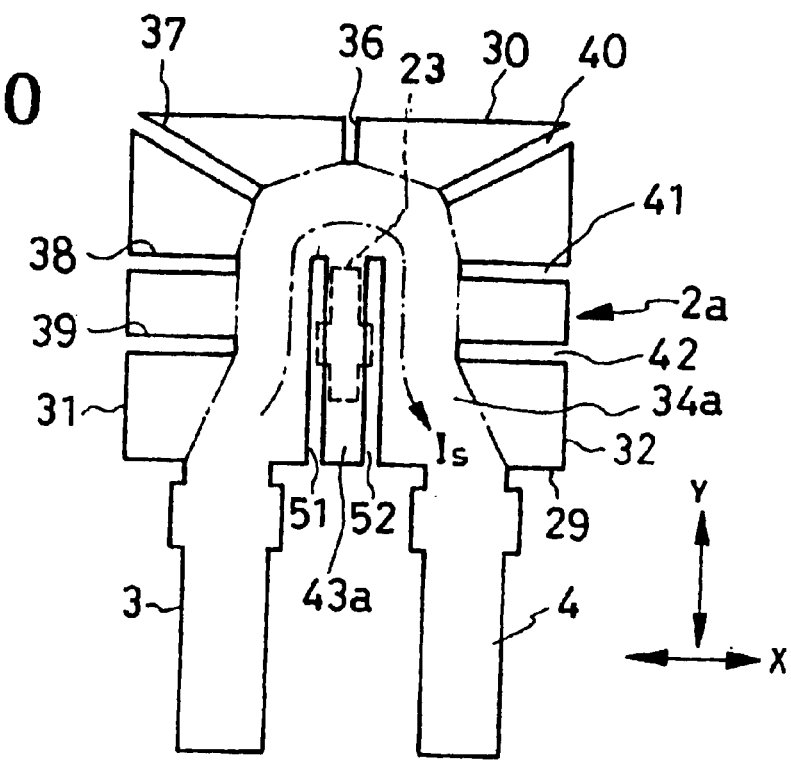
FIG. 10 is a view similar to FIG. 5 but showing another preferred embodiment of the invention.

FIG. 10 shows a modified baseplate 2a according to the invention, for use in the FIGS. 1–9 current detector in substitution for its baseplate 2. The modified baseplate 2a features a pair of straight slits 51 and 52 cut in the baseplate 2a in place of the J slit 35, FIG. 5, of the first disclosed baseplate 2 for delineating the inside boundary of the U-shaped current path 34a. The other details of construction are as set forth above with reference to FIG. 5. Thus, for example, the outer periphery of the current path 34a is bound by the slits 36–42.

The pair of slits 51 and 52 extend in parallel spaced relationship to each other from the edge 29 of the baseplate 2a halfway toward the opposite edge 30. The distance between the left-hand edge, as seen in FIG. 10, of the left-hand slit 51 and the right-hand edge of the right-hand slit 52 is approximately equal to the dimension in the x direction, FIG. 8, of the fifth semiconductor region 23 of the FIGS. 1–9 current detector, so that the primary working part of the Hall-effect device is substantially contained between the outer edges of the slits 51 and 52.

The tongue-like part 43a of the baseplate 2a, left between the slits 51 and 52, does not take part in carrying the current to be detected but serves merely to radiate heat and mechanically support the Hall-effect device.

Third Form

Figure 11:
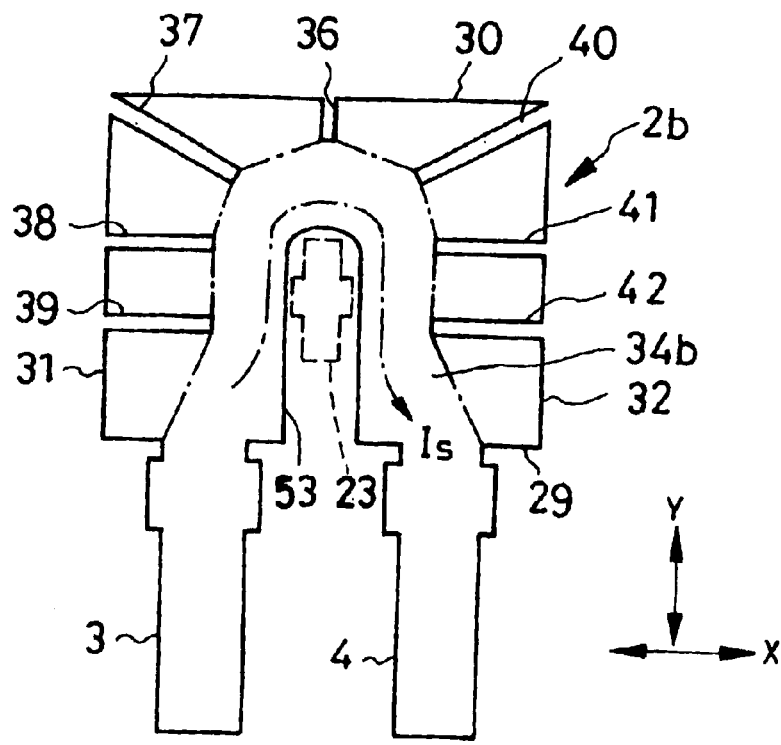
FIG. 11 is also a view similar to FIG. 5 but showing still another preferred embodiment of the invention.

In FIG. 11 is shown another modified baseplate 2b featuring a straight slit 53 of much greater width than the FIG. 5 J slit 35 or FIG. 10 parallel straight slits 51 and 52, for bounding the inner edge of the U-shaped current path 34b. The baseplate 2b is akin in the other details of construction to the FIG. 5 baseplate 2.

The wide, straight slit 53 extends from the edge 29 of the baseplate 2b halfway toward the opposite edge 30. The width of this slit is approximately equal to the dimension of the fifth semiconductor region 23, FIG. 8, of the Hall-effect device 1 in the x direction and less than the dimension of the semiconductor substrate 18 in the same direction. The length of the slit 53 is greater than the dimension of the semiconductor region 23 in the y direction.

Thus the current path 34b is formed so as to substantially surround the semiconductor region 23 of the Hall-effect device. The current detector employing this base plate 2b will therefore gain all but the fifth of the ten advantages set forth in conjunction with the FIGS. 1–9 embodiment.

Fourth Form

Figure 12:
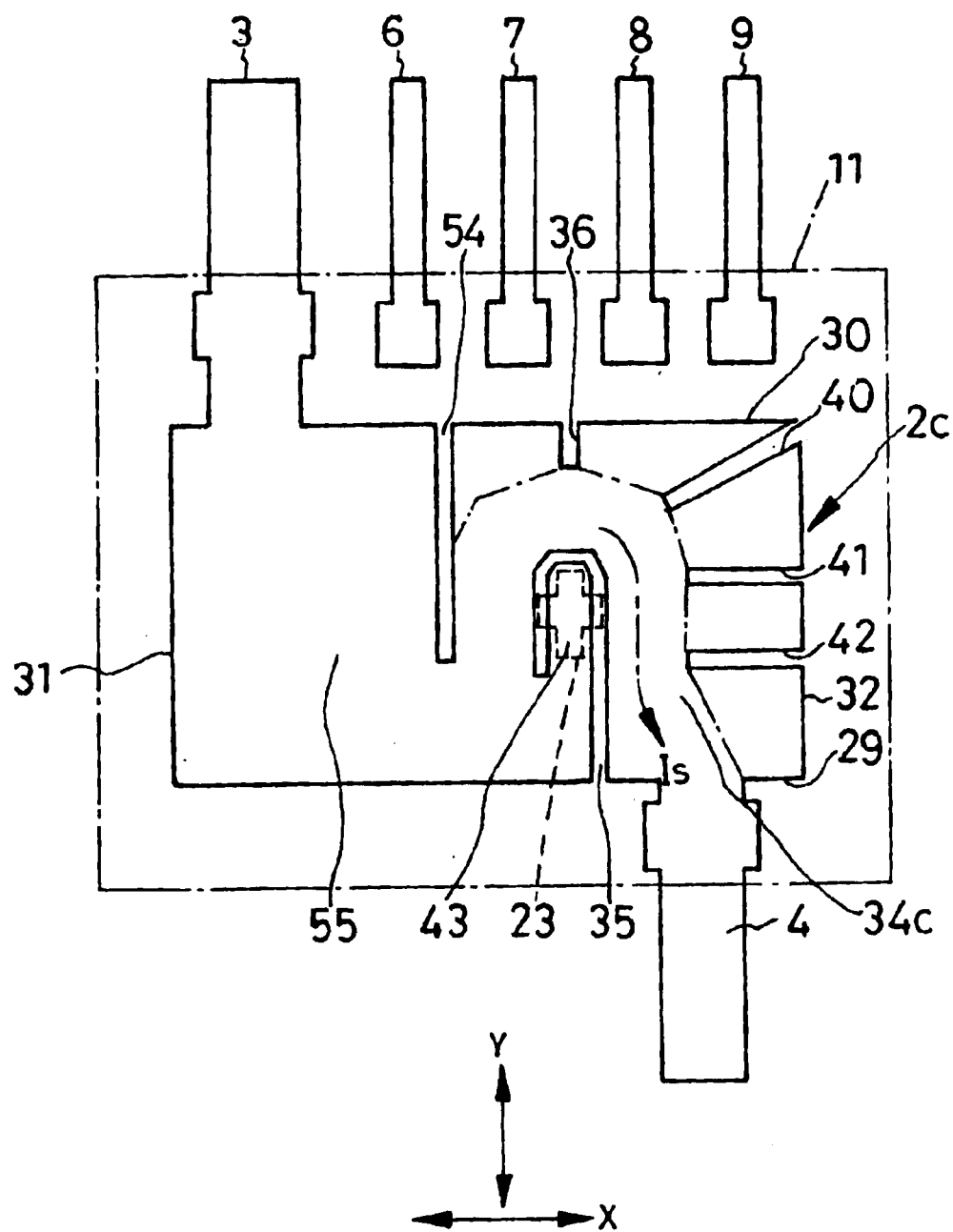
FIG. 12 is also a view similar to FIG. 5 but showing yet another preferred embodiment of the invention.

Still another modified baseplate 2c shown in FIG. 12 is similar to the FIG. 5 baseplate 2 in having the J slit 35 defining the inner boundary of the U-shaped current path 34c, but different therefrom in not having the three straight slits 37–39 defining part of the outer periphery of the current path. Employed in lieu of these absent slits is a single straight slit 54 extending from the edge 30 more than halfway toward the opposite edge 29. Thus does the current path 34c have its outer periphery bounded by this additional straight slit 54 and the remaining straight slits 36 and 40–42.

Another difference is that the baseplate 2c is of greater dimension in the x direction, having a current path extension 55 which is partly set off from the U-shaped current path 34c by the additional straight slit 54 but which is joined directly to one end of that current path as the slit 54 terminates short of the edge 29. The first current path terminal 3 is joined to this current path extension 55 at the baseplate edge 30. The second current path terminal 4 is in the same position as in all the previous embodiments.

Perhaps the most pronounced feature of this baseplate 2c is that the two current path terminals 3 and 4 project in opposite directions therefrom. This terminal arrangement can be convenient in some applications of the invention.

Fifth Form

Figure 13:
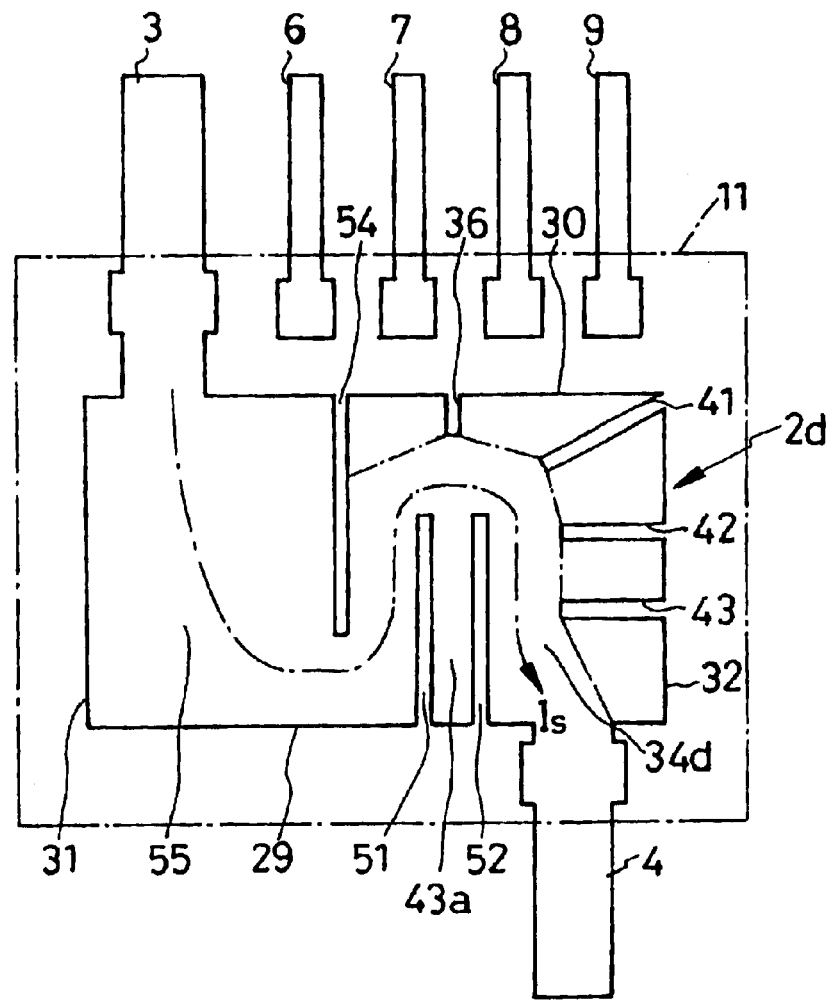
FIG. 13 is also a view similar to FIG. 5 but showing a further preferred embodiment of the invention.

FIG. 13 shows a slight modification 2d of the FIG. 12 baseplate 2c. Instead of the J slit 35 of the baseplate 2c there are formed a pair of straight slits 51 and 52 akin to those designated by the same reference numerals in FIG. 10. The baseplate 2d is identical with the baseplate 2c in the other details of construction.

Sixth Form

Figure 14:
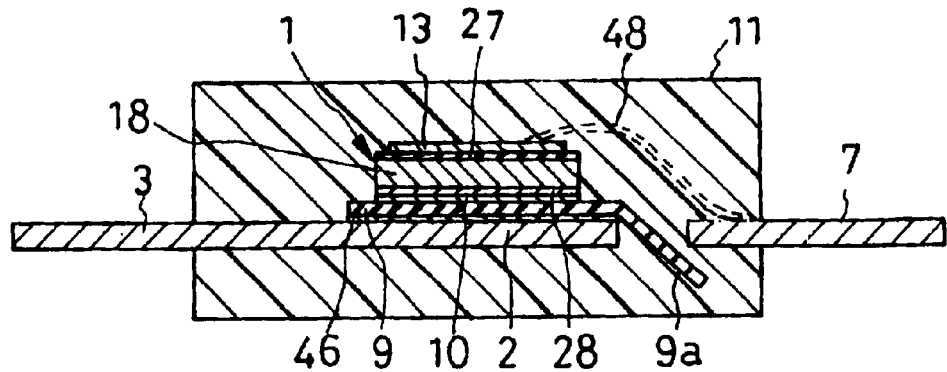
FIG. 14 is a view similar to FIG. 2 but showing a yet further preferred embodiment of the invention.

FIG. 14 shows a further modified current detector in a view similar to FIG. 2. This modified current detector differs from that of FIGS. 1–9 only in that the insulating plate 9 has an extension 9a which is angled downwardly, as seen in FIG. 14, to intervene between the baseplate 2, which may be any of the constructions disclosed herein, and the set of lead terminals 5–8. The insulating plate extension 9a is designed for better insulation of the lead terminals from the baseplate.

Seventh Form

Figure 15:
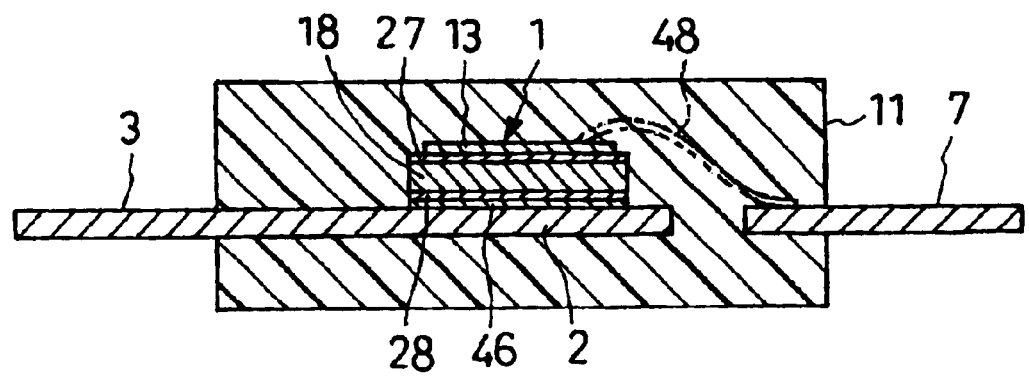
FIG. 15 is also a view similar to FIG. 2 but showing a still further preferred embodiment of the invention.

Notwithstanding the teachings of the FIGS. 1–9 and FIG. 14 embodiments the provision of the insulating plate 9 is not a necessity. Thus, in FIG. 15, a current detector is shown, also in a view similar to FIG. 2, which has no insulating plate, and no shielding layer either.

Experiment has proved that no inconvenience occurs without the insulating plate 9. Without the shielding layer 10, too, the Hall-effect device is protected from external noise by the semiconductor substrate 18, if it is of silicon, which is relatively high in conductivity. This current detector may therefore be put to use in locations immune from noise, as it possesses the same advantages as the FIGS. 1–9 embodiment in all other respects.

Eighth Form

Figure 16:
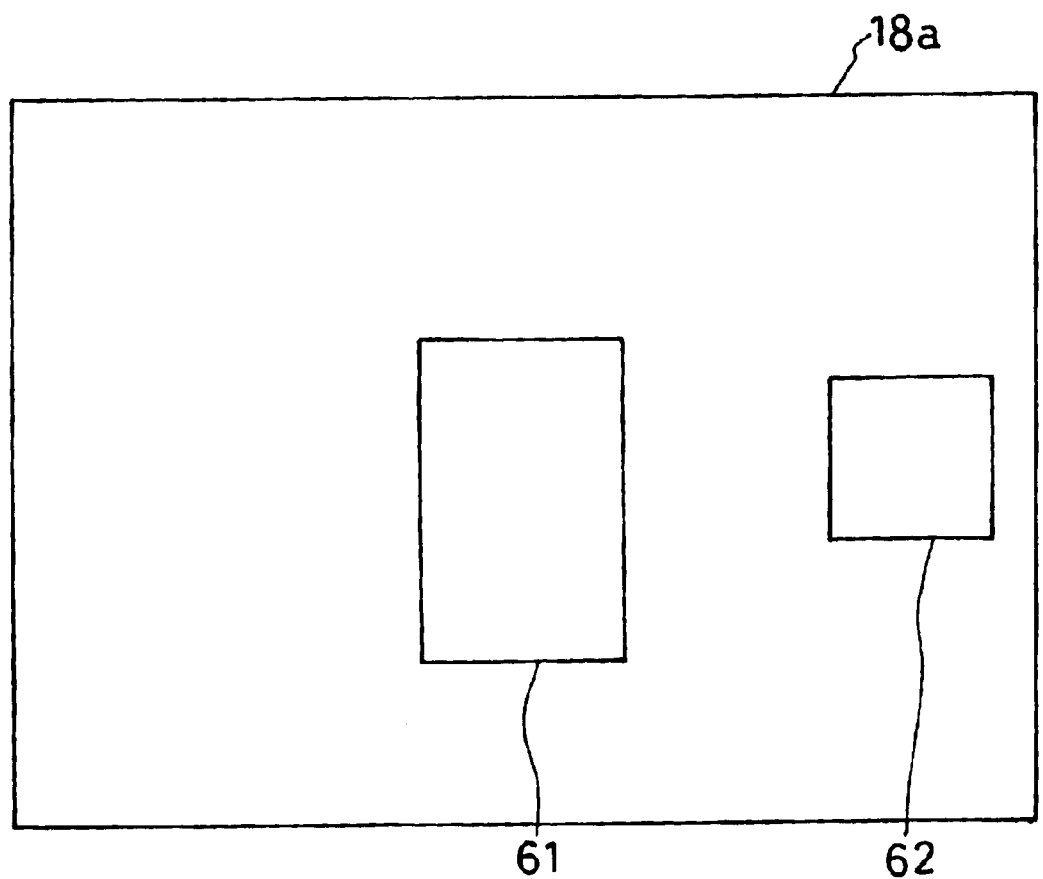
FIG. 16 is a schematic plan view of the semiconductor substrate of a further yet preferred embodiment of the invention.

Any of the current detectors herein disclosed may be formed in one piece with the amplifier shown at 17 in FIG. 9. FIG. 16 shows a semiconductor substrate 18a on which there are formed both a Hall-effect device 61 and an amplifier 62. The current detector built as taught by this invention, and incorporate not only the Hall-effect device 61 but also the amplifier 62, will be easier of handling, and the amplifier will be less in cost of manufacture.

Ninth Form

Figure 17:
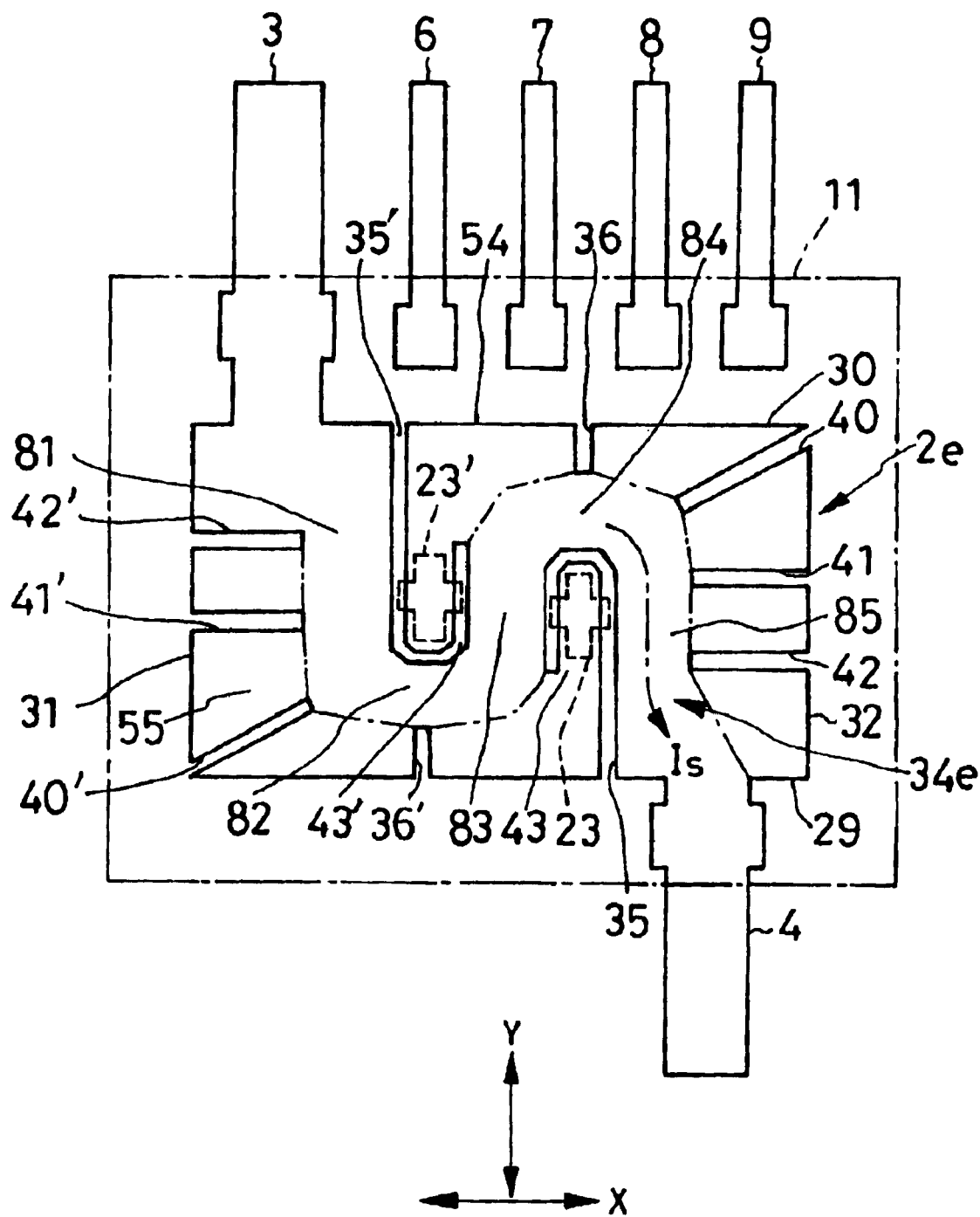
FIG. 17 is a view similar to FIG. 5 but showing a further still preferred embodiment of the invention.
Figure 18:
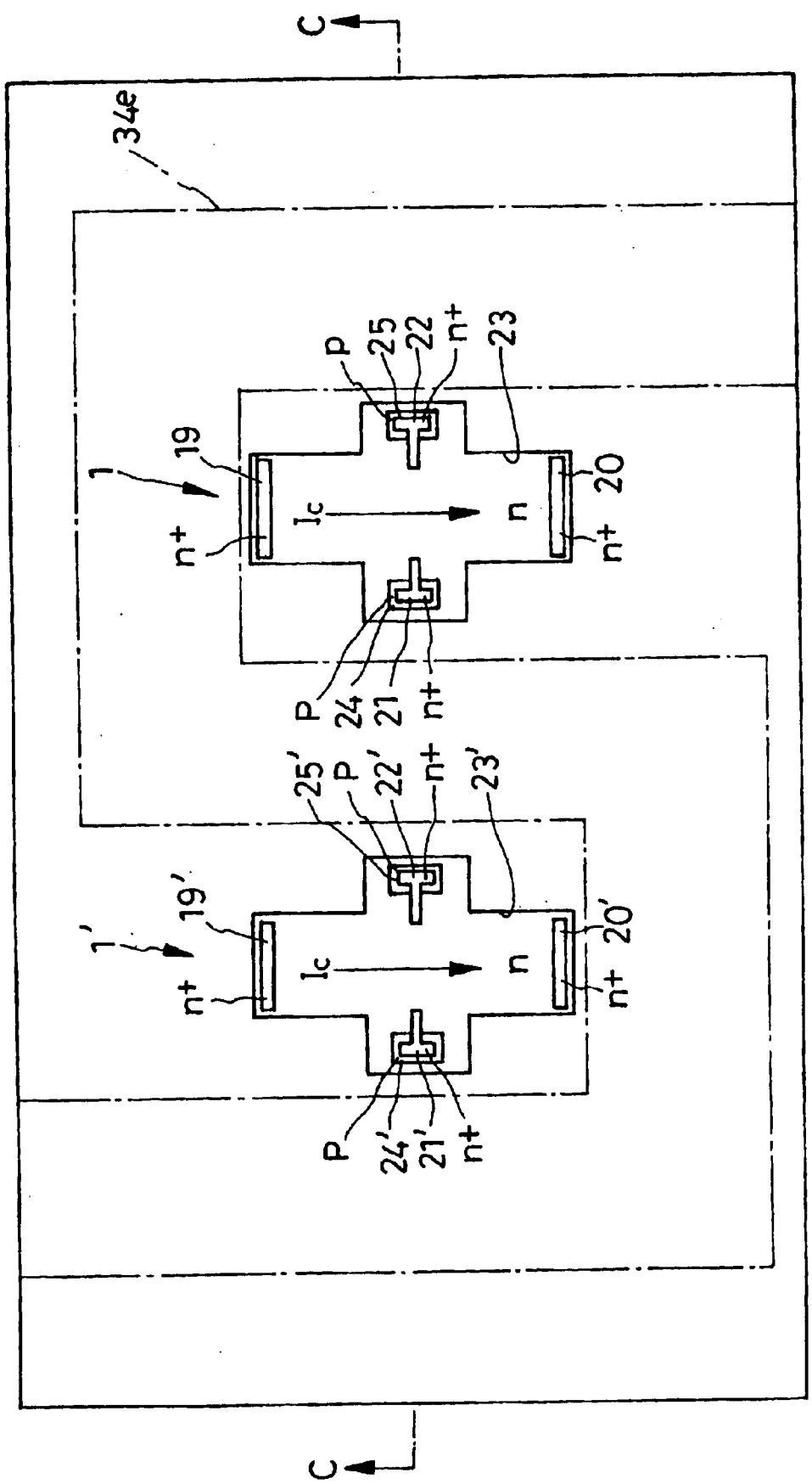
FIG. 18 is an enlarged plan view of the semiconductor substrate, together with two Hall-effect devices formed therein, of the FIG. 17 embodiment.
Figure 19:
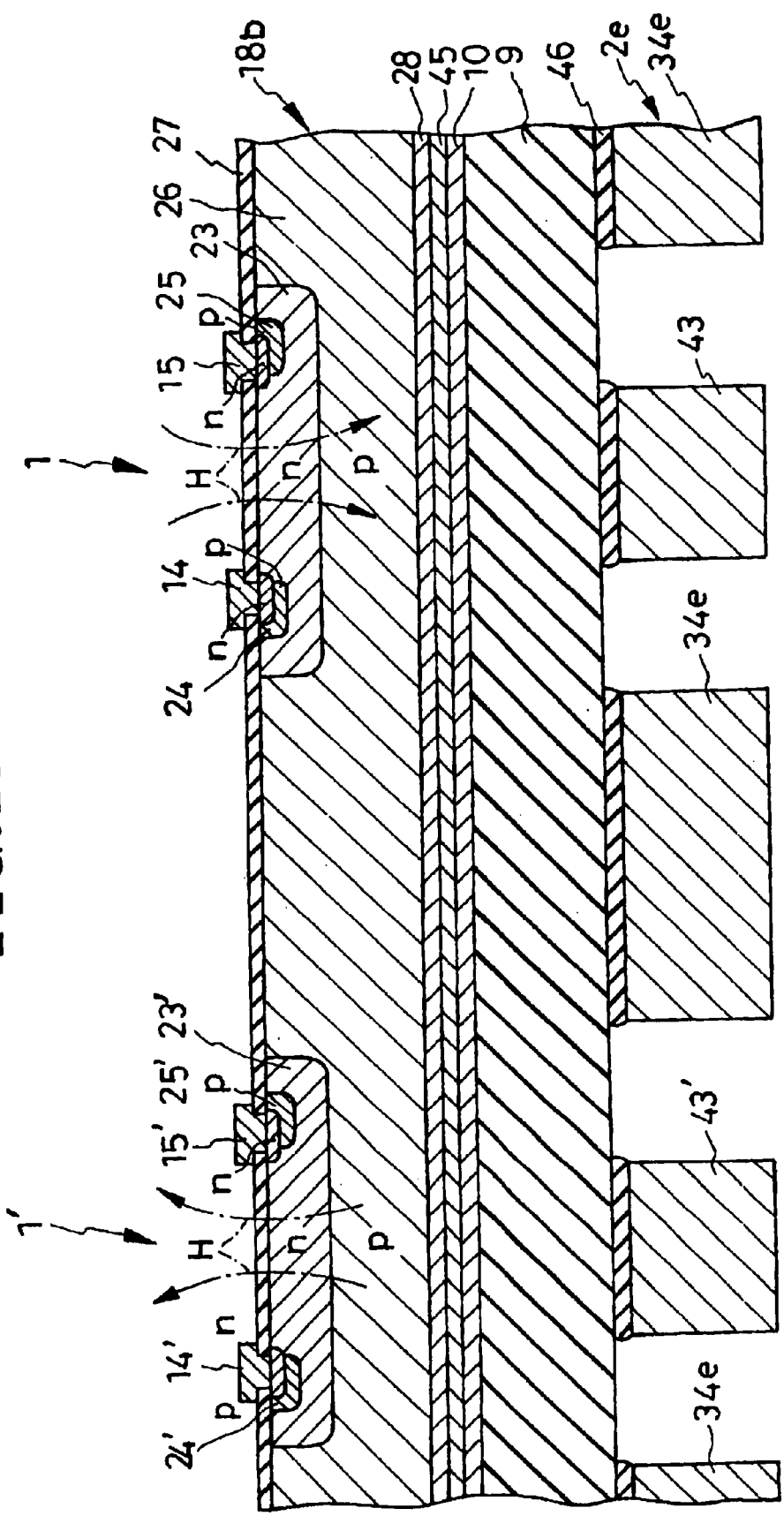
FIG. 19 is an enlarged section through the FIG. 17 embodiment, taken along the line C—C in FIG. 18.
Figure 20:
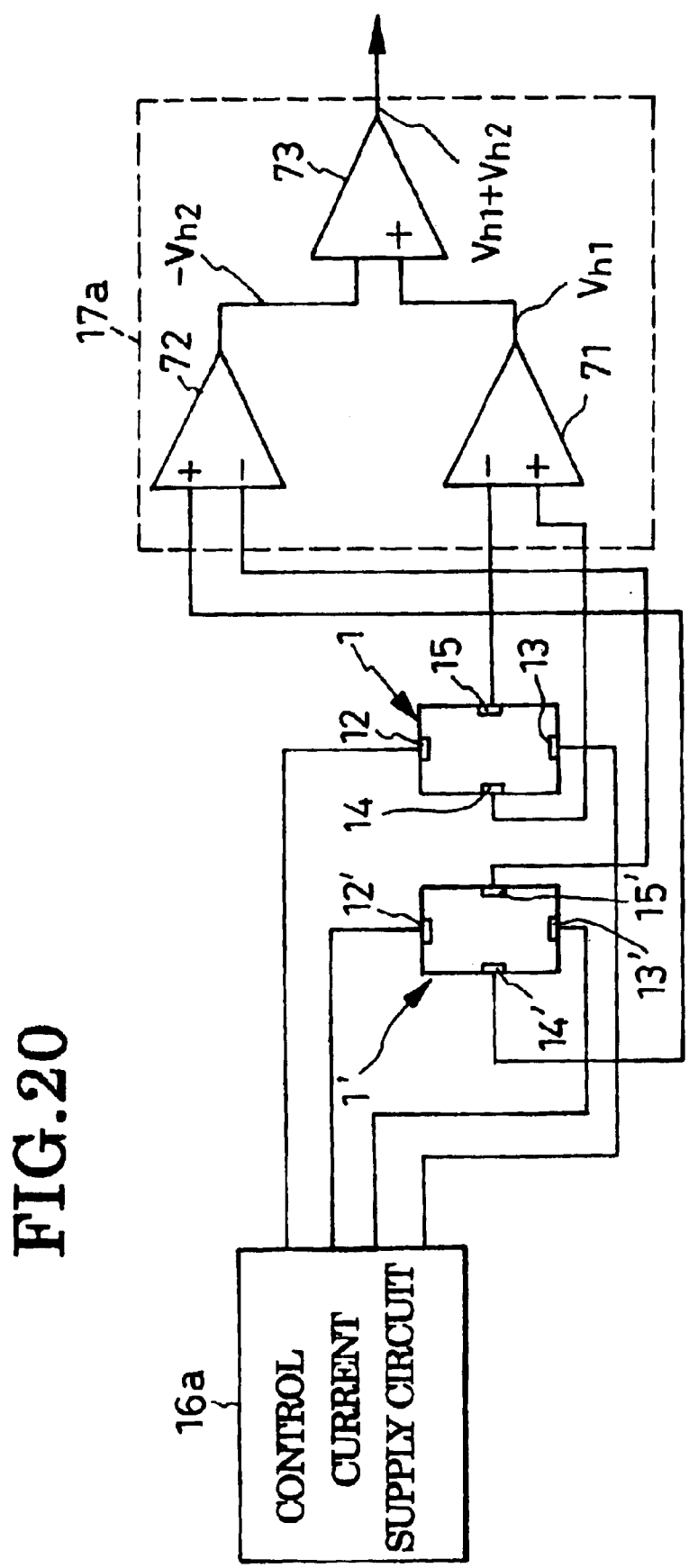
FIG. 20 is a schematic electrical diagram of the FIG. 17 embodiment shown together with a control current supply circuit and an output circuit.

FIGS. 17–20 are directed to the final embodiment of the invention, which differs from all the preceding ones in incorporating two Hall-effect devices for conjointly detecting a current. The two Hall-effect devices, seen at 1 and 1' in FIGS. 18–20, are both of the same construction as that of the FIGS. 1–9 embodiment. The various parts of the first Hall-effect device 1 are therefore indicated in FIGS. 18–20 by the same reference numerals as used to denote the corresponding parts of the FIGS. 1–9 device 1, and the various parts of the second Hall-effect device 1' by priming the reference numerals designating the corresponding parts of the first device 1.

As pictured in FIG. 19, both Hall-effect devices 1 and 1' are fabricated in one and the same semiconductor substrate 18b, although the two devices could be formed in separate substrates. This substrate 18b is mounted on a baseplate 34e via the shielding layer 45 and insulating plate 9, just as the substrate 18, FIG. 7, of the Hall-effect device 1 of the FIGS. 1–9 embodiment is. Any further repetitive description of the Hall-effect devices 1 and 1' is considered redundant.

The baseplate 2e of this current detector is modified as shown in FIG. 17 both for mechanically supporting the two Hall-effect devices 1 and 1' and for providing a recumbent-S-shaped current path 34e along which the current is to flow in proximity to the semiconductor regions 23 and 23', the primary working parts, of both devices. The S-shaped current path 34e is defined by two J slits 35 and 35' and eight straight slits 36, 36', 40–42, and 40'–42'. It will be understood that the J slit 35 and four straight slits 36 and 40–42 are cut in the baseplate 2e just like their counterparts in FIG. 5, defining the right hand half, as seen in FIG. 17, of the S-shaped current path 34e.

The left hand half of the current path 34e, then, is defined by the other J slit 35' and the other straight slits 36' and 40'–42'. The J slit 35', which is of the same shape and size as the J slit 35, is cut into the baseplate 2e from its edge 30. The straight slit 36' extends from the baseplate edge 29 toward the opposite edge 30 and terminates short of the bight of the J slit 35'. The straight slit 40' extends from the corner between the baseplate edges 29 and 31 toward the geometric center of the baseplate 2e and terminates short of the J slit 35'. The straight slits 41' and 42' extend from the baseplate edge 31 toward the opposite edge 32 and terminate short of the J slit 35'.

Thus the S-shaped current path 34e is constituted of first part 81 between baseplate edge 31 and J slit 35', second part 82 between J slit 35' and baseplate edge 29, third part 83 between J slits 35 and 35', fourth part 84 between J slit 35 and baseplate edge 30, and fifth part 85 between J slit 35 and baseplate edge 32. The current path terminal 3 is joined to the baseplate edge 30 in a position forming one end of the current path 34e. The other current path, terminal 4 is joined to the baseplate edge 29 in a position forming the other end of the current path 34e.

It will also be observed from FIG. 17 that the primary working region 23 of the first Hall-effect device 1 lies between the third 83 and the fifth 85 part of the current path 34e. The primary working region 23' of the second Hall-effect device 1' lies between the first 81 and the third 83 part of the current path 34e. The midpart 83 of the current path 34e is thus shared by both devices 1 and 1'.

FIG. 20 is explanatory of how the two Hall-effect devices 1 and 1' are connected to a control current supply circuit 16a and an amplifier circuit 17a, which are both adapted for use with current detectors having two Hall-effect devices. The electrodes 12 and 13, set forth for the FIGS. 1–9 embodiment with reference to FIG. 9, of the first Hall-effect device 1, and the corresponding electrodes 12' and 13' of the second Hall-effect device 1, are both connected to the four outputs of the control current supply circuit 16a.

The amplifier circuit 17a comprises three differential amplifiers 71, 72 and 73. The first amplifier 71 has a noninverting input connected to the electrode 14, and an inverting input connected to the electrode 15, of the first Hall-effect device 1. The second amplifier 72 has a noninverting input connected to the electrode 14', and an inverting input connected to the electrode 15', of the second Hall-effect device 1'. The outputs of the amplifiers 71 and 72 are connected to the third amplifier 73.

Operation of Ninth Form

As the current Is flows along the S-shaped current path 34e in the baseplate 2e in the direction of the arrow in FIG. 17, from terminal 3 to terminal 4, the magnetic fields H acting on the two Hall-effect devices 1 and 1' will be oriented in the opposite directions indicated by the arrows in FIG. 19. Thus the differential amplifiers 71 and 72 will put out Hall voltages $Vh_1$ and $-Vh_2$ of opposite polarities. Inputting these Hall voltages, the third differential amplifier 73 will provide an output voltage according to the equation, $Vh_1-(-Vh_2)=Vh_1+Vh_2$. The output from the amplifier 73 will thus be the sum of the absolute values of the outputs $Vh_1$ and $-Vh_2$ from the two amplifiers 71 and 72. The same output could be obtained, of course, by providing an inverter on the output stage of the amplifier 72 and by providing an adder in place of the amplifier 73.

The advantages that are won exclusively by this ninth embodiment of the invention are as follows:

1. Higher sensitivity is obtained as the current is detected in terms of the sum of the absolute values of the outputs from the two Hall-effect devices.
2. D spit use of two Hall-effect devices, the resulting increase in size is reduced to a minimum as they share the midpart 83, FIG. 17, of the S-shaped current path 34e.
3. Since the two Hall-effect devices are acted upon in the opposite directions by the magnetic fields H due to the flow of the current Is along the S-shaped current path 34e, cancellation will occur between the noise components of the output voltages of both devices due to external magnetic fields. Let Vo be the Hall voltage of each Hall-effect device due to an external magnetic field. Then the output from the first amplifier 71 is defined as $Vh_1+Vo$, the output from the second amplifier 72 as $-Vh_2+Vo$, and the output from the third amplifier 73 as $Vh_2+Vo-(-Vh_2+Vo)=Vh_1+Vh_2$.

Possible Modifications

Despite the foregoing detailed disclosure, it is not desired that the present invention be limited by the exact showings of the drawings or by the description thereof. The following is a brief list of possible modifications, alterations and adaptations of the illustrated embodiments which are all believed to fall within the scope of the invention:

1. A magnetic collector plate could be provided on the surface of the semiconductor substrate away from the baseplate in all the embodiments disclosed.
2. Only a prescribed fraction of the incoming current could be made to flow along the current path in the baseplate for measurement of its total magnitude.
3. The semiconductor substrate 23 could be fabricated from semiconductors other than silicon, such as 3–5 group compounds. Although the resulting substrate would be more susceptible to external magnetic fields or induction noise, no inconvenience would occur thanks to the shielding layer 10.
4. Either or both of the insulating plate 9 and shielding layer 17 could be omitted from the second to sixth, and eighth to ninth embodiments, as in the seventh.

What is claimed is:

1. A current detector or detecting or measuring an electric current, comprising:
   (a) two Hall-effect devices each for generating a voltage proportional to magnetic field strength;
   (b) two current path terminals for the inflow and outflow, respectively, of a current to be detected or measure; and
   (c) a metal-made baseplate mechanically supporting the Hall-effect devices, the baseplate being slitted to define current path having a pair of opposite extremities connected respectively to the current path terminals, the current path being contiguous to the Hall-effect devices for causing the same to generate voltages proportional to the magnitude of a current flowing through the current path;
   (d) whereby the magnitude of the current flowing through the current path is detectable in terms of the sum of the absolute values of the output voltages of the Hall-effect devices.

2. The current detector of claim 1 wherein the current path in the baseplate is in the shape of an S.

3. The current detector of claim 2 wherein the baseplate is a generally rectangular piece of sheet metal having a first edge, a second edge opposite to the first edge, a third edge at right angles with the first and the second edge, and a fourth edge opposite to the third edge, wherein the baseplate has a first slit cut into the baseplate from the first edge thereof to bound part of one side edge of the S-shaped current path, and a second slit cut into the baseplate from the second edge thereof to bound part of another side edge of the current path, wherein the current path comprises a first part between the third baseplate edge and the second slit, a second part between the first baseplate edge and the second slit, a third part between the first and the second slit, a fourth part between the second baseplate edge and the first slit, and a fifth part between the fourth baseplate edge and the first slit, and wherein the two current path terminals are joined respectively to the first and the second edge of the baseplate in positions continuous to the first and the fifth part of the current path.

4. The current detector of claim 3 wherein each Hall-effect device has a primary working part for the development of the voltage proportional to the magnitude of the current flowing through the current path in the baseplate, the primary working parts of the two Hall-effect devices being substantial thoroughly contained respectively between the first and the third part, and between the third and the fifth part, of the current path, both as seen in a direction normal to the baseplate.

5. The current detector of claim 1 further comprising an output circuit for combining the absolute values of the output voltages of the Hall-effect devices.

6. The current detector of claim 5 wherein the output circuit comprises:
   (a) two amplifiers connected respectively to the Hall-effect devices; and
   (b) arithmetic means connected to the amplifiers for providing an output representative of the sum of the absolute values of outputs from the amplifiers.

* * * * *

UNITED STATES PATENT AND TRADEMARK OFFICE
CERTIFICATE OF CORRECTION

PATENT NO. : 6,791,313 B2
DATED : September 14, 2004
INVENTOR(S) : Koji Ohtsuka

It is certified that error appears in the above-identified patent and that said Letters Patent is hereby corrected as shown below:

Column 11,
Line 35, please delete "D spit" and insert therefore -- Despite --;
Line 49, please delete "$Vh_2 + Vo$-" and insert therefore -- $Vh_1 + Vo$- --;

Column 12,
Line 13, please delete "measure" and insert therefore -- measured --;

Signed and Sealed this

Nineteenth Day of April, 2005

JON W. DUDAS
*Director of the United States Patent and Trademark Office*